April 7, 1964 R. E. NORWOOD 3,128,040

FLUID LOGIC DEVICE

Filed Oct. 29, 1962 2 Sheets-Sheet 1

INVENTOR
RICHARD E. NORWOOD

BY Henry E. Otto Jr

ATTORNEY

April 7, 1964 R. E. NORWOOD 3,128,040

FLUID LOGIC DEVICE

Filed Oct. 29, 1962 2 Sheets-Sheet 2

United States Patent Office 3,128,040

Patented Apr. 7, 1964

3,128,040

FLUID LOGIC DEVICE

Richard E. Norwood, Endicott, N.Y., assignor to International Business Machines Corporation, New York, N.Y., a corporation of New York Filed Oct. 29, 1962, Ser. No. 233,574
10 Claims. (Cl. 235—61)

This invention relates to fluid logic devices, and more particularly to those capable of performing logic functions in a fluid digital computer apparatus.

Fluid devices are known wherein a low energy fluid input or control signal can impinge upon and effect switching of a higher energy fluid power stream to a selectable outlet. Since the output signal is thus of greater energy than the input signal, these devices have been referred to in the art as "fluid amplifiers." These devices possess the advantages of being inexpensive and requiring no movable solid elements. Although these fluid amplifier devices have heretofore been used as "building blocks" in various forms of fluid digital computer apparatus, there appears to be no compact and reliable fluid logic device capable of being associated with these fluid amplifier devices to perform logic functions comparable to those achievable with electronic logic blocks.

One object of this invention is therefore to provide a simple, inexpensive, reliable fluid device which comprises no moving parts and yet is capable of performing logic functions.

Another object is to provide a fluid device capable of performing a logical AND function in a fluid digital computer apparatus.

According to these objects, the fluid device embodying the invention comprises means providing two input passages having substantially aligned portions that meet at a junction and are both open to an output passage that extends generally transversely from said junction. When pressure fluid is supplied to either, but not both, of the input passages, one of said passages will serve as an inlet and the other of said passages will serve as an outlet and receive the pressure fluid discharged from the inlet. However, if pressure fluid is supplied concurrently to both of the input passages, the pressure fluid streams will collide head-on at said junction and then flow laterally into the output passage to provide a logical AND fluid pressure output signal. This output signal is used to initiate a desired control operation. For example, if the output passage extends from the junction of the "AND block" to a control port in a bistable or monostable type of fluid amplifier device having a plurality of outlets, the said output signal can switch a fluid power stream from one outlet to another outlet, in the manner hereinafter more fully described.

The foregoing and other objects, features and advantages of the invention will be apparent from the following more particular description of the fluid devices embodying the invention and illustrated in the accompanying drawings, wherein.

Figure 1:
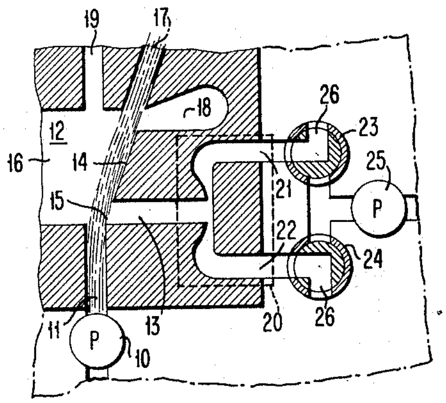
FIG. 1 is a schematic elevational section view of a fluid device embodying a fluid logic device that performs a two-way logical AND function.

*Description—FIG. 1*

In the fluid device illustrated in this figure, pressure fluid from a pump 10 flows through an inlet 11 into a chamber 12. At the exit end of inlet 11 is an output passage or control port 13 that opens through a side wall 14 of the chamber 12. Side wall 14 is set back somewhat from the exit end of the inlet and diverges at an angle therefrom to create a boundary layer control region 15 at the mouth of the control port 13. There is a large opening 16 opposite the divergent side wall 14. Hence, as the fluid power stream flows from inlet 11 into chamber 12, the fluid present in region 15 will be entrained by the stream and cause a low pressure to be developed in said region. This low pressure will tend to pull or divert the power stream toward wall 14, and thus cause said stream to "lock on" to said wall.

The fluid power stream will therefore normally flow along the side wall 14, as indicated by the broken flow lines in FIG. 1, and be discharged through an outlet 17. If some impedance tends to obstruct the discharge of fluid from the outlet 17, a back pressure might build up and separate the power stream from wall 14. To prevent this, an escape port 18 is provided to permit the escape of excess fluid in case of an obstruction or load or other impedance in outlet 17.

When pressure fluid is supplied to control port 13, such fluid will enter the control region 15 and, by enlarging the separation bubble in said region, cause the power stream to break away from wall 14 and be discharged temporarily into another outlet 19. The opening 16 will serve a function comparable to that of escape port 18 if there should be any obstruction or impedance in outlet 19.

The device as thus far described constitutes a so-called "fluid amplifier device."

According to one feature of the invention, pressure fluid may be supplied to control port 13 via a fluid logic device 20 that conveniently and inexpensively forms a two-way AND logic function. Device 20 comprises two input passages 21, 22, at least portions of which are substantially aligned and meet at a junction to form the crossbar of a T; the leg of the T being the control port 13 which is open to and extends transversely from the junction of the passages 21, 22. At least one of the side walls of each passage 21, 22 is preferably curved to provide a venturi-like throat to increase the velocity of the fluid somewhat as it flows in either direction between the passages 21, 22, and at the same time provide a reduced pressure within the control port at the junction.

By way of diagrammatic illustration, valves 23, 24 are shown as being interposed between the passages 21, 22, respectively, and a common source of pressure fluid, such as a pump 25. Each valve 23, 24 is shown as being of the type having a rotary plug with a cavity 26. When each plug is rotated a quarter turn from the position in which it is shown, to a supply position, the particular cavity will supply pressure fluid from pump 25 to the appropriate passage 21 or 22. However, when either plug is in a vent position, in which it is shown, the corresponding cavity 26 is so disposed as to disconnect the respective passage 21 or 22 from pump 25 and connect such passage to atmosphere. It is important to note that pressure fluid may be supplied to the input passages 21, 22 either selectively or concurrently, but when pressure fluid is not being supplied to passage 21 or 22, reverse flow of pressure fluid through such passage is permitted. In other words, input passages 21 and 22 are never blocked off.

*Operation—FIGURE 1*

In operation, assume that the pump 10 is operating; that the fluid power stream is locked on to wall 14; and that valves 23, 24 are in vent position. Under the assumed conditions, the various components and the fluid power stream will be in the respective positions in which they are shown in FIG. 1.

Assume now that pressure fluid is supplied to input passage 21, such as by operating valve 23 to its supply position. The pressure fluid supplied to passage 21 will flow through the throat at the junction within device 20 and into passage 22 and be discharged to atmosphere via cavity 26 of valve 24. Similarly, if pressure fluid is supplied to input passage 22 but not to the passage 21, the pressure fluid will flow from passage 22 through the throat in device 20 and into passage 21 and be discharged to atmosphere via cavity 26 of valve 23. Thus, in either of these situations, where only one of the input passages 21 or 22 is charged, the other of said passages will act as a receiver and dump the fluid to atmosphere without causing an increase in pressure in the control port 13.

However, if pressure fluid is concurrently supplied to both of the input passages 21 and 22 (such as by concurrently operating the valves 23 and 24 to supply position in the embodiment illustrated), then the pressure fluid supplied to said passages can escape only via the control port 13. Thus, as the fluid moves into the throat of device 20, it will be diverted laterally into the control port 13 and enlarge the separation bubble at the boundary layer control region 15. This, in turn, will cause the fluid power stream to be diverted away from wall 14 and into the outlet 19. The fluid power stream will be directed into outlet 19 until supply of pressure fluid to control port 13 is terminated. Such termination will occur, in the embodiment illustrated, when one or both of the valves 23, 24 are operated to vent position and thereby terminates concurrent supply of pressure fluid to passages 21, 22.

Thus, the fluid logic device 20 comprises two input passages 21, 22 having portions that are generally aligned and adapted to be selectively or concurrently charged with pressure fluid. When pressure fluid is supplied to one of the input passages 21 or 22, the pressure fluid will be discharged through the other of said passages; but when pressure fluid is supplied concurrently to both of said passages, pressure fluid will be supplied to the transverse output passage or control port 13 to provide a logical AND fluid pressure output signal or pulse to perform a desired control operation.

Figure 2:
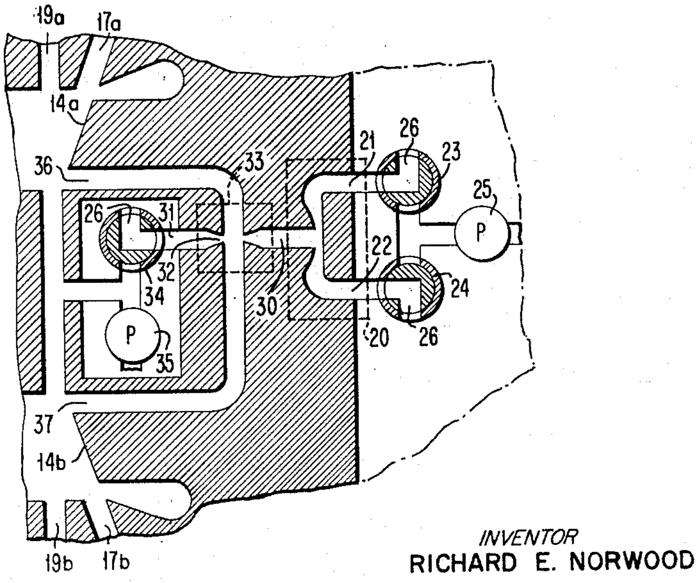
FIG. 2 is a schematic elevational section view of a fluid device embodying means for performing a three-way AND function and providing a double or dual output signal.

*Description and Operation—FIGURE 2*

The device shown in this figure differs from that shown in FIG. 1 in that the junction of the fluid logic device 20 is connected to a transverse output passage 30 (instead of to control port 13). Passage 30 and a substantially coaxially aligned passage 31 have oppositely arranged side walls that both curve convexly toward each other to provide a venturi-like throat 32. These passages 30, 31 form part of a second logic device 33. A valve 34 controls selective connection of passage 31 to atmosphere (as shown) or to a source of pressure fluid, such as a pump 35. Extending transversely from and open to the throat 32 at the junction of the passages 30, 31 are two output passages which constitute part of respective control ports 36, 37 of different fluid amplifier devices. These fluid amplifier devices are essentially like the one illustrated in FIG. 1 and already described; and hence similar reference numerals, but with suffixes, will be used to identify parts which are essentially identical with those shown and described in connection with FIG. 1.

In operation, when pressure fluid is supplied concurrently to input passages 21, 22, pressure fluid will flow into output passage 30, which also serves as an input passage to device 33. If, at such time, passage 31 is vented via cavity 26 of valve 34, then the pressure fluid supplied to passage 30 will flow through the throat and be discharged to atmosphere via valve 34. Hence, no output signal will be delivered to the control ports 36 and 37; and thus the power streams will remain locked on to the walls 14*a*, 14*b* and discharge from outlets 17*a* 17*b*, respectively. If, however, pressure fluid is concurrently supplied to the input passages 21, 22 (and hence to passage 30) and also to passage 31, then such pressure fluid can and will be discharged through the control ports 36, 37. This will cause the fluid power streams to break way from the walls 14*a*, 14*b* and be diverted into outlets 19*a*, 19*b* until the supply of pressure fluid to one or more of the passages 21, 22, 31 is terminated and such passages are connected to atmosphere.

Thus, the device illustrated in FIG. 2 gives an output signal only when a three-way AND logic condition is satisfied. It will be apparent that fluid logic devices, like 20 or 33, may be combined in such manner as to provide a fluid output signal or pulse for any desired number of concurrent inputs. For example, to provide a four-way AND logic device, the parts 34, 31 would be removed and a second set of the parts 21, 22, 23, 24, 30 substituted therefor in the structure shown in FIG. 2.

Moreover, in the device illustrated in FIG. 2, two output lines 36, 37 lead from the junction or throat 32 of the logic device 33 to deliver dual or parallel output signals concurrently and conveniently to different destinations. If only one output line is desired from the junction, however, the configuration of the junction is preferably modified to that shown in FIG. 1; i.e., only the side wall through which the output signal-receiving passage (like 13) opens is actually convexly curved, and the other side wall is substantially straight.

It will be apparent that the valves 23, 24, 34 are used only for purposes of schematic illustration. They may, if desired, be mechanically, electronically or electrically operated. However, in most cases, valves will not be necessary, as will be understood from the following description.

Figure 3:
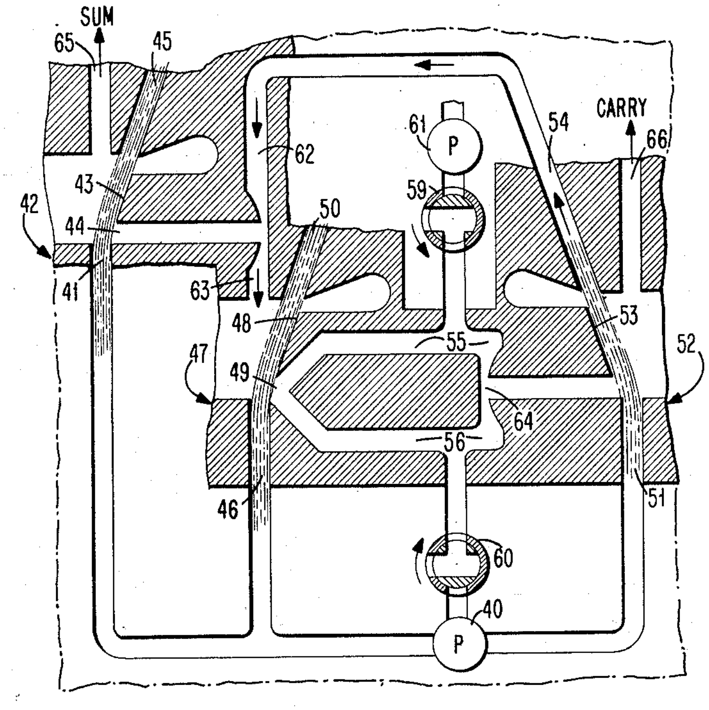
FIG. 3 is a schematic view of a fluid half adder device that employs logical AND devices of the type shown in FIG. 1 and forms part of a fluid digital computer apparatus.

*Description and Operation—FIG. 3*

This figure shows a half adder device that employs fluid logic devices for performing logical AND functions in a fluid digital computer apparatus. This half adder device comprises a pump 40 that supplies a fluid power stream via an inlet 41 to a fluid amplifier device 42. This stream normally is locked on to a divergent side wall 43 for reasons already described (due to the boundary layer control region at 44) and is normally directed into an outlet 45.

Meanwhile, pump 40 also supplies another fluid power stream via an inlet 46 to a fluid amplifier device 47. The power stream in device 47 normally is locked on to a divergent side wall 48 (due to the boundary layer control region at 49) and is normally directed into an outlet 50. Also, pump 40 supplies a fluid power stream via an inlet 51 to a fluid amplifier device 52. The stream in device 52 is normally locked on to a divergent side wall 53 and is directed into an outlet 54, for the same reasons as in device 42.

It is to be noted that two conduits 55, 56 converge at an angle at the boundary layer control region 49. Supply of pressure fluid to conduits 55, 56 is controlled by suitable means, such as respective valves 59, 60, that (like the valves 23, 24 already described) selectively connect these conduits to atmosphere or to respective pumps 61, 40.

With the half adder device as thus far described, pressure fluid normally will flow from pump 40 via inlet 51 and along wall 53 into outlet 54 and then via the two aligned passages 62, 63 of an AND logic device into the fluid amplifier device 47. This will not affect lock on of the power stream in device 47 to side wall 48. Since no pressure is being supplied to passage 63, the stream in device 42 will remain locked on to wall 43. Thus, the half adder will be in a stable state as indicated in FIG. 3.

When pressure fluid is supplied to either conduit 55 or conduit 56 (but not both), fluid from one of said conduits will flow across the junction at 64 of the AND logic device and be discharged to atmosphere from the valve 60 or 59 associated with the other conduit, respectively. Hence, the power stream in device 52 will remain unaffected and will continue to be discharged into outlet 54. However, in the meantime, a logical OR pressure fluid pulse will be transmitted to region 49 and cause the power stream in device 47 to leave wall 48 and discharge into outlet passage 63. Since passage 62 is then receiving pressure fluid via the outlet 54, as above described, an AND pressure fluid output signal pulse will be delivered to region 44 in device 42 and cause the power stream therein to switch to an outlet 65 that connotes a SUM. In other words, a pressure fluid pulse in outlet 65 indicates that conduit 55 or 56, but not both, are charged, thereby to connote an exclusive OR condition.

If pressure fluid is supplied to both conduits 55 and 56 concurrently, however, an AND pressure fluid output signal will be transmitted via the junction at 64 to the device 52 and divert the power stream therein from wall 53 and cause it to discharge into an outlet 66 that connotes a CARRY. In other words, a pressure fluid pulse in outlet 66 indicates that both conduits 55 and 56 are charged.

When supply of pressure fluid to conduits 55, 56 is terminated, the fluid power streams in the various devices 42, 47 and 52 will resume their normal positions, in which they are locked on to the walls 43, 48 and 53, respectively.

Figure 4:
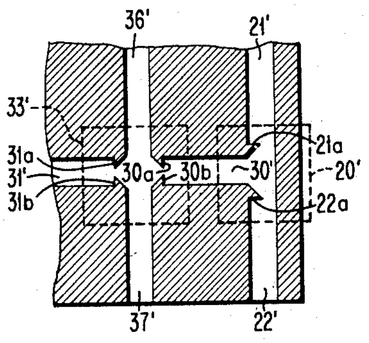
FIG. 4 is a fragmentary view of another embodiment of a fluid logic device which may be used in lieu of that shown in FIG. 2 to perform a three-way logical AND function with a dual output signal.

*Description and Operation—FIG. 4*

This figure shows a modified version of the three-way AND fluid logic device with the dual output signal. Like reference numerals will be used in FIG. 4, but primed, to denote elements which are functionally though not necessarily structurally similar to those of FIG. 2.

According to the embodiment of FIG. 4, the substantially coaxially aligned input passages 21′, 22′ of one logic device 20′ have transverse shoulders **21*a*, 22*a*, respectively, that partially obstruct or restrict flow to the junction of said passages. These shoulders face in the direction of fluid flow and are provided at opposite sides of the transverse opening or passage 30′ that forms one input passage to another AND logic device 33′. Device 33′ has another input passage 31′ substantially coaxially aligned with passage 30′. Passages 30 and 31 have transverse shoulders 30*a*, 30*b* and 31*a*, 31*b* that face in the direction of fluid flow through these respective passages and project from each side wall to constrict the dimension of the stream and deflect the stream away from oppositely arranged output passages 36′, 37′ upon selective but not concurrent supply of pressure fluid to the passage 30′ or 31′. These shoulders 30*a*, 30*b* and 31*a*, 31*b*** are so configured as to induce a vena contracta in the respective power streams. In the embodiment illustrated in FIG. 4, the downstream end of each shoulder is tapered to produce an angled side wall to provide a sharp edge at the upstream end of each input passage to induce the vena contracta. This permits such stream to pass through the oppositely arranged input passage without overflow into the output passage when pressure fluid is supplied to only one input passage.

Thus, upon concurrent supply of pressure fluid to input passages 21′, 22′ of device 20′, an output pulse will be transmitted to the transverse passage 30′. If the passages 30′ and 31′ are concurrently supplied with pressure fluid, such pressure fluid will be discharged via the output passages 36′ and 37′, thus denoting that the three-way AND condition has been satisfied. But, if only one of the input passages is charged, the other of the input passages will serve as an output passage; and the flow-constricting transverse shoulders will prevent flow into the output passages.

It may here be noted that the transverse shoulders (or the convexly curved side walls in FIGS. 1 through 3) are provided in only certain of the side walls of the respective input passages. More specifically, they are provided in those particular side walls which are at opposite sides of a transverse output opening to deflect the stream away from such opening. In other words, if output passage 37′ were eliminated, shoulders **30*b* and 31*b* would likewise be eliminated and the lower walls of the passages 30′, 31′ would merge without obstruction, similar to the right-hand walls of the input passages 21′, 22′ of device 20′**.

Also, it should be noted that needle valves (not shown) or tuning chokes (not shown) may be employed in the ports or passages 13, 30, 31, 36 and/or 37 to tune the apparatus according to the configuration of the fluid conveying ports or passages and rate of fluid flow selected.

While the invention has been particularly shown and described with reference to preferred embodiments, it will be understood by those skilled in the art that the foregoing and other changes in form and details may be made therein without departing from the spirit and scope of the invention.

What is claimed is:

1. A fluid device comprising,
means providing two input passages to which pressure fluid can be supplied selectively or concurrently, said input passages being joined at a junction and having substantially aligned orifices disposed at opposite ends of said junction, and
an output passage extending generally transversely from said junction,
such that upon supply of pressure fluid to only one of said input passages, such fluid will flow past said output passage and out the other of the input passages, whereas
upon supply of pressure fluid concurrently to both input passages, such fluid will flow laterally into the output passage to give a logical AND fluid pressure output signal.

2. A fluid logic device according to claim 1, wherein said orifices are of smaller dimension than said input passages to constrict flow in either direction past the output passage and thus minimize the possibility of flow of pressure fluid into the output passage during selective supply of pressure fluid to either input passage.

3. A fluid logic device for performing a logical AND function, comprising
means providing two input passages to which pressure fluid can be supplied selectively or concurrently, said input passages having respectively aligned orifices,
means providing an output passage which is open to an area between said orifices and extends generally laterally from such area, and
means for inducing a vena contracta as fluid flows from either input passage toward and into the other of said input passages,
such that upon supply of pressure fluid to only one of said input passages, such fluid will flow past said output passage and out the other of the input passages, whereas
upon supply of pressure fluid concurrently to both input passages, such fluid will flow laterally into the output passage to give a logical AND fluid pressure output signal.

4. In a fluid device, the combination of
means providing two input passages to which pressure fluid can be supplied selectively or concurrently, said input passages having substantially aligned portions that meet at a junction, and
an output passage joining said two portions at said junction and extending generally transversely thereof;
such that during concurrent supply a head-on collision of the streams will occur at the junction and produce a logical AND fluid pressure output signal in said output passage, whereas upon supply of pressure fluid to only one of said input passages, the other of said input passages will receive the stream from said one passage to prevent such signal from being developed in said output passage.

5. The combination according to claim 4, including means for reducing the dimension of the streams as they flow in either direction past the junction, thereby to increase the velocity and reduce the pressure of the fluid flowing past said output passage and normally deflect either stream away from the output passage thus preventing flow of pressure fluid into the output passage except when pressure fluid is supplied concurrently to both input passages.

6. The combination according to claim 4, wherein the input passages have walls, the adjoining parts of which are convexly curved to provide a constricted throat at the junction to increase the fluid velocity between said input passages and discourage unintended spillage of fluid into said output passage during supply of pressure fluid to only one of said input passages, and wherein said output passage opens through the convexly curved portion of such throat.

7. The combination according to claim 4, wherein the input passages have walls, and including flow-constricting transverse shoulders that project transversely inward from said walls at opposite sides of said junction and are provided only in those particular walls through which the output passage opens.

8. In a fluid device, means for performing a logical AND function, said means comprising two input passages to which pressure fluid can be supplied selectively or concurrently, and an output passage intersecting with said input passages in a generally T-like relation, each of the two input passages constituting the crossbar of the T, said passages being so configured that upon supply of pressure fluid concurrently to both of said input passages, such pressure fluid will be forced to escape through the output passage and thereby produce a logical AND fluid pressure output signal therein, whereas upon supply of pressure fluid solely to one of said input passages, such pressure fluid will be directed into and escape through the other of said input passages to prevent an output signal from being produced in said output passage.

9. A fluid device comprising means providing at least two outlets into which a fluid power stream is selectively directable, and a control port chargeable with pressure fluid to divert the stream from one of the outlets to another of the outlets; and a fluid logic device comprising a pair of passages that are selectively or concurrently chargeable with pressure fluid and join at a junction and provide a lateral opening that connects said junction with said control port, so that upon concurrent supply of pressure fluid to said passages, pressure fluid is supplied to the control port via said lateral opening to cause diversion of the stream to said other outlet, and upon charging of only one of said passages, the fluid from said charged passage will flow through the junction and past said lateral opening and be discharged through the other passage to prevent supply of pressure fluid to said control port and thus prevent switching of the stream to said other outlet.

10. A fluid half adder comprising three fluid amplifier devices, each having respective one outlets into which a corresponding fluid power stream is normally directed;

two conduits selectively or concurrently chargeable with pressure fluid, said conduits having respective one ends that converge at an angle at a boundary layer control region of one of the devices and having respective other ends that join head-on at a junction, one control port extending laterally from said junction to a boundary layer control region of the second device, said one device having a second outlet which joins the said one outlet of said second device head-on at a junction, and another control port which extends laterally from the last-named junction to a boundary layer control region of the third device, whereby upon supply of pressure fluid to only one of said conduits, the stream in said one device will be diverted from the corresponding one outlet into said second outlet and collide with the stream then flowing into said one outlet of said second device to produce an output signal in said other control port to switch the stream in said third device to another outlet thereof to provide a SUM-connoting output signal, and upon concurrent charging of both conduits, pressure, fluid will flow via the first mentioned junction to said one control port and divert the stream in said second device from said one outlet thereof to a CARRY-connoting outlet thereof.

References Cited in the file of this patent

UNITED STATES PATENTS 3,068,880 Riordan ---------------- Dec. 18, 1962

FOREIGN PATENTS 1,323,784 France ---------------- Mar. 4, 1963

OTHER REFERENCES

Article, "Hydraulics Half-Add Binary Numbers," Control Engineering, February 1961, p. 145.